US009972517B2

United States Patent
Miki

(10) Patent No.: US 9,972,517 B2
(45) Date of Patent: May 15, 2018

(54) ANOMALY DETECTION SYSTEM AND METHOD OF MANUFACTURING SEMICONDUCTOR DEVICE

(71) Applicant: TOSHIBA MEMORY CORPORATION, Tokyo (JP)

(72) Inventor: Tsutomu Miki, Mie (JP)

(73) Assignee: Toshiba Memory Corporation, Tokyo (JP)

( * ) Notice: Subject to any disclaimer, the term of this patent is extended or adjusted under 35 U.S.C. 154(b) by 397 days.

(21) Appl. No.: 14/645,978

(22) Filed: Mar. 12, 2015

(65) Prior Publication Data
US 2016/0056064 A1 Feb. 25, 2016

(30) Foreign Application Priority Data
Aug. 25, 2014 (JP) .................................. 2014-170924

(51) Int. Cl.
*H01L 21/67* (2006.01)
*G05B 23/02* (2006.01)

(52) U.S. Cl.
CPC .... *H01L 21/67288* (2013.01); *G05B 23/0235* (2013.01); *G05B 2219/45031* (2013.01)

(58) Field of Classification Search
CPC .......... H01L 21/67288; G05B 23/0235; G05B 2219/45031
See application file for complete search history.

(56) References Cited

U.S. PATENT DOCUMENTS

| 6,766,275 B2 | 7/2004 | Samata et al. |
| 6,865,513 B2 | 3/2005 | Ushiku et al. |
| 6,944,572 B2 | 9/2005 | Ushiku et al. |
| 7,702,413 B2 * | 4/2010 | Ushiku .............. G05B 19/4184 438/770 |
| 9,741,230 B2 * | 8/2017 | Matsumoto .......... G08B 21/182 |
| 9,759,458 B2 * | 9/2017 | Nakajima ............... F25B 21/04 |
| 2003/0009311 A1 | 1/2003 | Ushiku et al. |

(Continued)

FOREIGN PATENT DOCUMENTS

| JP | 2002-285974 | 10/2002 |
| JP | 2003-77780 | 3/2003 |

(Continued)

*Primary Examiner* — Laura Menz
(74) *Attorney, Agent, or Firm* — Finnegan, Henderson, Farabow, Garrett & Dunner, L.L.P.

(57) ABSTRACT

According to one embodiment, there is provided an anomaly detection system for a second unit incidental to a first unit that processes a substrate. The anomaly detection system includes a collecting unit, a first calculating unit, a second calculating unit, and a determining unit. The collecting unit is configured to collect a plurality of types of parameters related to a state of the second unit. The first calculating unit is configured to calculate a divergence of a coordinate point from a reference space in a virtual coordinate space of a plurality of types of parameters, the coordinate point being indicated by the plurality of types of collected parameters. The second calculating unit is configured to accumulate the calculated divergence and calculate a cumulative divergence. The determining unit is configured to compare the calculated cumulative divergence with a threshold value and determine an anomaly in the second unit.

20 Claims, 9 Drawing Sheets

(56) References Cited

U.S. PATENT DOCUMENTS

| | | | |
|---|---|---|---|
| 2003/0154052 A1 | 8/2003 | Samata et al. | |
| 2004/0143418 A1 | 7/2004 | Ushiku et al. | |
| 2004/0218520 A1* | 11/2004 | Aizawa | H04L 25/0232 370/203 |
| 2005/0067098 A1* | 3/2005 | Hughes | H01J 37/3244 156/345.1 |
| 2006/0224267 A1* | 10/2006 | Higashide | G05B 23/0235 700/109 |
| 2007/0010906 A1* | 1/2007 | Abe | H01L 21/67253 700/121 |
| 2008/0283088 A1* | 11/2008 | Shima | H01J 37/32862 134/1.1 |
| 2014/0244020 A1* | 8/2014 | Ikeda | H01L 22/12 700/110 |
| 2015/0121899 A1* | 5/2015 | Nakajima | F25B 21/04 62/3.3 |
| 2016/0056064 A1* | 2/2016 | Miki | H01L 21/67288 702/182 |
| 2016/0163179 A1* | 6/2016 | Matsumoto | G08B 21/182 340/540 |

FOREIGN PATENT DOCUMENTS

| | | | | |
|---|---|---|---|---|
| JP | 2004-232968 | | 8/2004 | |
| JP | 2005-009337 | | 1/2005 | |
| JP | 2009-9300 | | 1/2009 | |
| JP | 2011-146073 | | 7/2011 | |
| JP | 2011-166427 | | 8/2011 | |
| JP | 2016045808 A | * | 4/2016 | H01L 21/67288 |
| WO | WO 2006070689 A1 | * | 7/2006 | C23C 16/4412 |
| WO | WO 2014115643 A1 | * | 7/2014 | G05B 19/418 |

* cited by examiner

US 9,972,517 B2

ANOMALY DETECTION SYSTEM AND METHOD OF MANUFACTURING SEMICONDUCTOR DEVICE

CROSS-REFERENCE TO RELATED APPLICATIONS

This application is based upon and claims the benefit of priority from Japanese Patent Application No. 2014-170924, filed on Aug. 25, 2014; the entire contents of which are incorporated herein by reference.

FIELD

Embodiments described herein relate generally to an anomaly detection system and a method of manufacturing a semiconductor device.

BACKGROUND

In a semiconductor device manufacturing process, when a substrate is processed to manufacture a semiconductor device through a first unit, a second unit incidental to the first unit performs an auxiliary operation on the first unit. At this time, in order to manufacture a semiconductor device properly, it is desirable to detect an anomaly in the second unit incidental to the first unit.

DETAILED DESCRIPTION

In general, according to one embodiment, there is provided an anomaly detection system for a second unit incidental to a first unit that processes a substrate. The anomaly detection system includes a collecting unit, a first calculating unit, a second calculating unit, and a determining unit. The collecting unit is configured to collect a plurality of types of parameters related to a state of the second unit. The first calculating unit is configured to calculate a divergence of a coordinate point from a reference space in a virtual coordinate space of a plurality of types of parameters, the coordinate point being indicated by the plurality of types of collected parameters. The second calculating unit is configured to accumulate the calculated divergence and calculate a cumulative divergence. The determining unit is configured to compare the calculated cumulative divergence with a threshold value and determine an anomaly in the second unit.

Exemplary embodiments of an anomaly detection system will be explained below in detail with reference to the accompanying drawings. The present invention is not limited to the following embodiments.

(First Embodiment)

Figure 1:
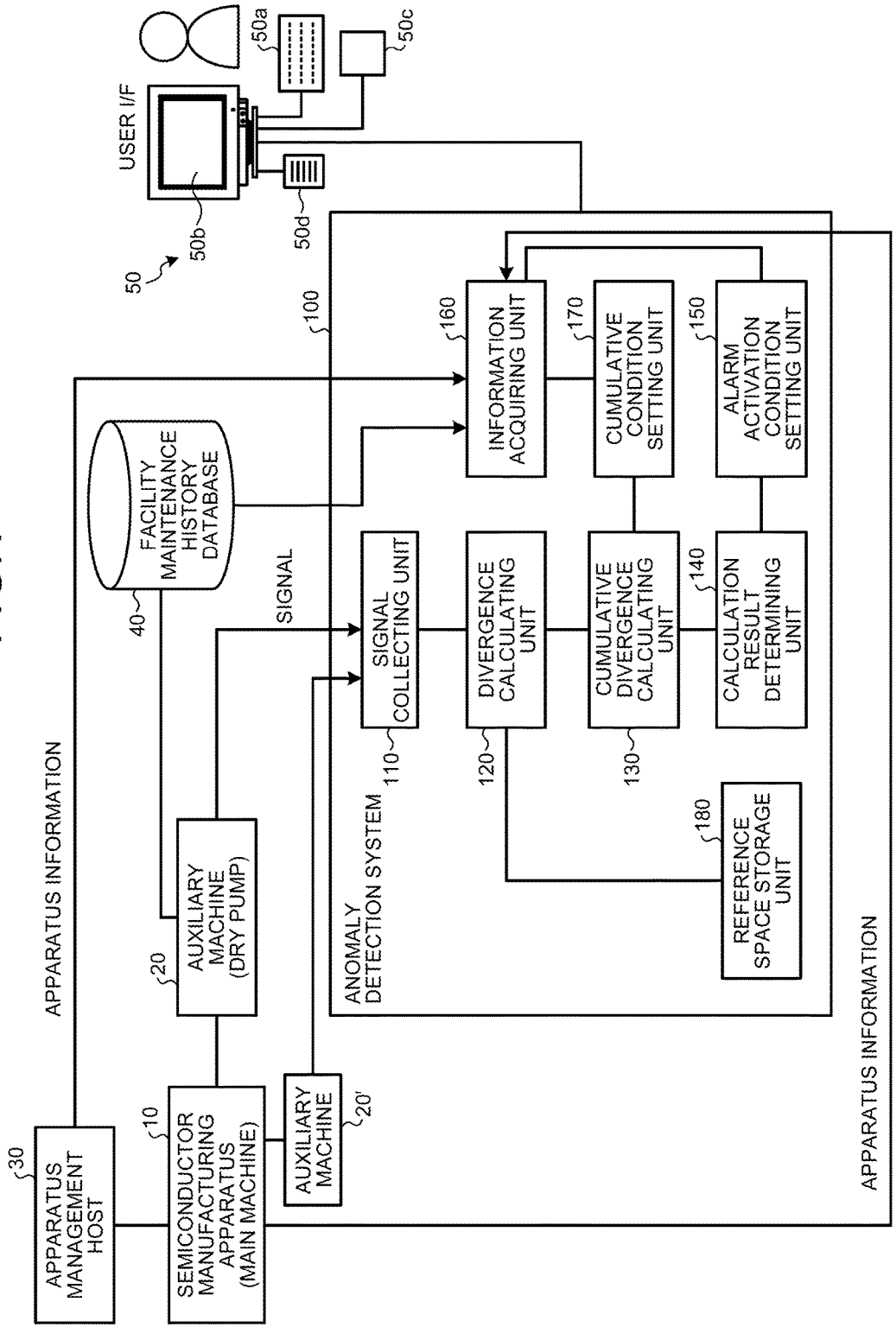
FIG. 1 is a diagram illustrating a configuration of an anomaly detection system according to a first embodiment.
Figure 2:
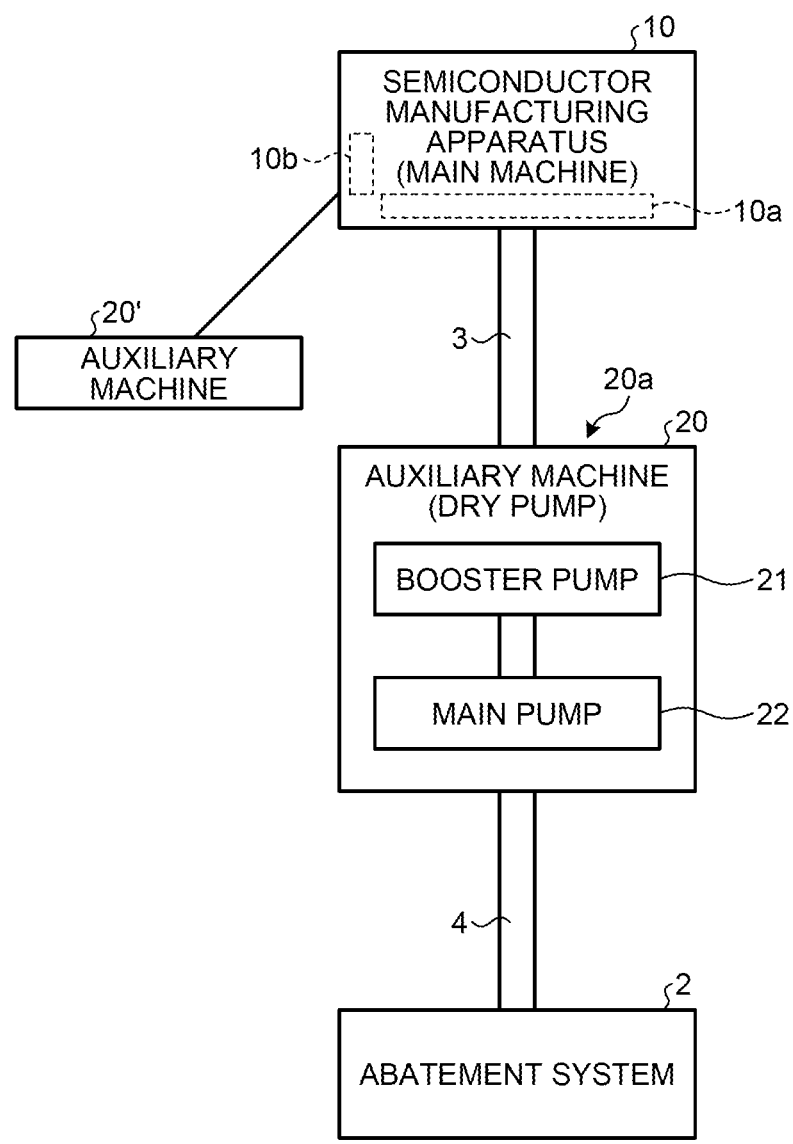
FIG. 2 is a diagram illustrating a configuration of an auxiliary machine according to the first embodiment.

An anomaly detection system 100 according to the first embodiment will be described with reference to FIGS. 1 and 2. FIG. 1 is a diagram illustrating a configuration of the anomaly detection system 100. FIG. 2 is a diagram illustrating a configuration of auxiliary machines 20 and 20' serving as a target whose anomaly is detected by the anomaly detection system 100.

The anomaly detection system 100 is used for anomaly detection or failure anticipation on the auxiliary machines (second units) 20 and 20' which are necessary to operate a semiconductor manufacturing apparatus (first unit) 10. The semiconductor manufacturing apparatus 10 is an apparatus that processes a substrate in order to manufacture a semiconductor device, and may be a film forming apparatus such as a CVD apparatus, a PVD apparatus, or a HVPE apparatus, an etching apparatus such as an RIE apparatus, or an impurity introducing apparatus such as an ion implantation apparatus. The auxiliary machines 20 and 20' are apparatuses incidental to the semiconductor manufacturing apparatus 10 (main machine), and undertake an auxiliary operation on the semiconductor manufacturing apparatus 10. The auxiliary machine 20 is, for example, a dry pump (a vacuum pump), and exhausts the vacuum chamber 10a in the semiconductor manufacturing apparatus 10 through an exhaust pipe 3 and adjusts pressure of a vacuum chamber 10a. The auxiliary machine 20' is, for example, a chiller, and causes a coolant to flow through a cooling pipe 10b formed on a wall surface of the vacuum chamber 10a in the semiconductor manufacturing apparatus 10 and cools the wall surface of the vacuum chamber 10a down.

It should be noted that, although FIG. 2 illustrates an example in which the two auxiliary machines 20 and 20' are incidental to the semiconductor manufacturing apparatus 10 (main machine), three or more auxiliary machines may be incidental to the semiconductor manufacturing apparatus 10 (the main machine). The following will proceed focusing on anomaly detection on the auxiliary machine 20, but the same applies to anomaly detection on other auxiliary machines (for example, the auxiliary machine 20').

As a method of anomaly detection or failure cycle anticipation of a certain apparatus, a method of acquiring one or more signals from a sensor installed in a certain apparatus through a certain communication device and setting a control limit to a statistical value such as a peak value or an average value and a processing value such as an increase rate or a frequency of occurrence on a change in the signal is considered. In other words, in order to detect an anomaly of a certain apparatus, an apparatus parameter indicating various operation states of the certain apparatus is monitored through a sensor. Then, when the apparatus parameter obtained from the sensor indicates an abnormal value, an alarm indicating that an anomaly has occurred in the certain apparatus (that a failure time is near) is generated. This method is based on an assumption that the level of the signal acquired from the certain apparatus changes over time (monotonically) as a failure time gets closer.

Meanwhile, the auxiliary machine 20 is likely to reach a failure state in a state in which a time-dependent change (for example, a change such as a monotonousness increase or a monotonousness decrease depending on time) is not seen in the level of the acquired signal. When a foreign substance from the vacuum chamber 10a in the semiconductor manufacturing apparatus 10 is mixed into a movable mechanism (for example, a rotational mechanism of a rotary) of the auxiliary machine 20 (for example, the dry pump), the signal acquired from the auxiliary machine 20 indicates the abnormal value while the foreign substance is stuck in the movable mechanism. Then, when the foreign substance comes from the movable mechanism to an abatement system 2 side through an exhaust pipe 4 illustrated in FIG. 2, the signal acquired from the auxiliary machine 20 returns to a normal value. However, mechanical fatigue is likely to be accumulated in the movable mechanism due to the foreign substance, and it is difficult to monitor that the movable mechanism is deteriorating based on the level of the signal acquired from the auxiliary machine 20 (parameter).

Thus, when the same method as the anomaly detection of the certain apparatus is applied to anomaly detection and failure anticipation of the auxiliary machine 20, it may be difficult to perform anomaly detection and failure anticipation, or the accuracy of anomaly detection and failure anticipation is likely to be lowered.

Further, progress easiness of deterioration of the auxiliary machine 20 depends on influence from the semiconductor manufacturing apparatus 10 (main machine) or an individual difference of the auxiliary machine 20. It is difficult to monitor the progress easiness of deterioration of the auxiliary machine 20 that can change dynamically or statically based on the level of the signal acquired from the auxiliary machine 20 (parameter).

From this point of view, when the same method as the anomaly detection of the certain apparatus is applied to anomaly detection and failure anticipation of the auxiliary machine 20, it may be difficult to perform anomaly detection and failure anticipation, or the accuracy of anomaly detection and failure anticipation is likely to be lowered.

In this regard, in a first embodiment, the anomaly detection system 100 accumulates divergences calculated by multivariate analysis, and performs anomaly detection as illustrated in FIG. 1. In other words, in the anomaly detection system 100, it is made possible to perform the progress of deterioration accumulated in the auxiliary machine 20 by collecting a plurality of types of parameters related to a state of the auxiliary machine 20, calculating and accumulating divergences of the plurality of types of collected parameters from a reference space indicating a normal state, and comparing a cumulative divergence with a threshold value.

Specifically, the anomaly detection system 100 includes a signal collecting unit 110, a divergence calculating unit (a first calculating unit) 120, a reference space storage unit 180, a cumulative divergence calculating unit (a second calculating unit) 130, an information acquiring unit 160, a cumulative condition setting unit 170, an alarm activation condition setting unit 150, and a calculation result determining unit 140.

The signal collecting unit 110 collects a plurality of types of parameters related to a state of the auxiliary machine 20. A plurality of sensors are installed in the auxiliary machine 20. The signal collecting unit 110 collects the plurality of types of parameters through a wireless or wired communication line from the plurality of sensors installed in the auxiliary machine 20. The plurality of types of parameters are parameters that are used for multivariate analysis.

For example, the auxiliary machine 20 illustrated in FIG. 2 is a dry pump (a vacuum pump). The dry pump (the vacuum pump) may be one which include a booster pump 21 and a main pump 22 or may be a single main pump 22. FIG. 2 illustrates an example in which the dry pump (the vacuum pump) serving the auxiliary machine 20 includes the booster pump 21 and the main pump 22.

The signal collecting unit 110 can collect parameters (signals) from a plurality of sensors.

Figure 3:
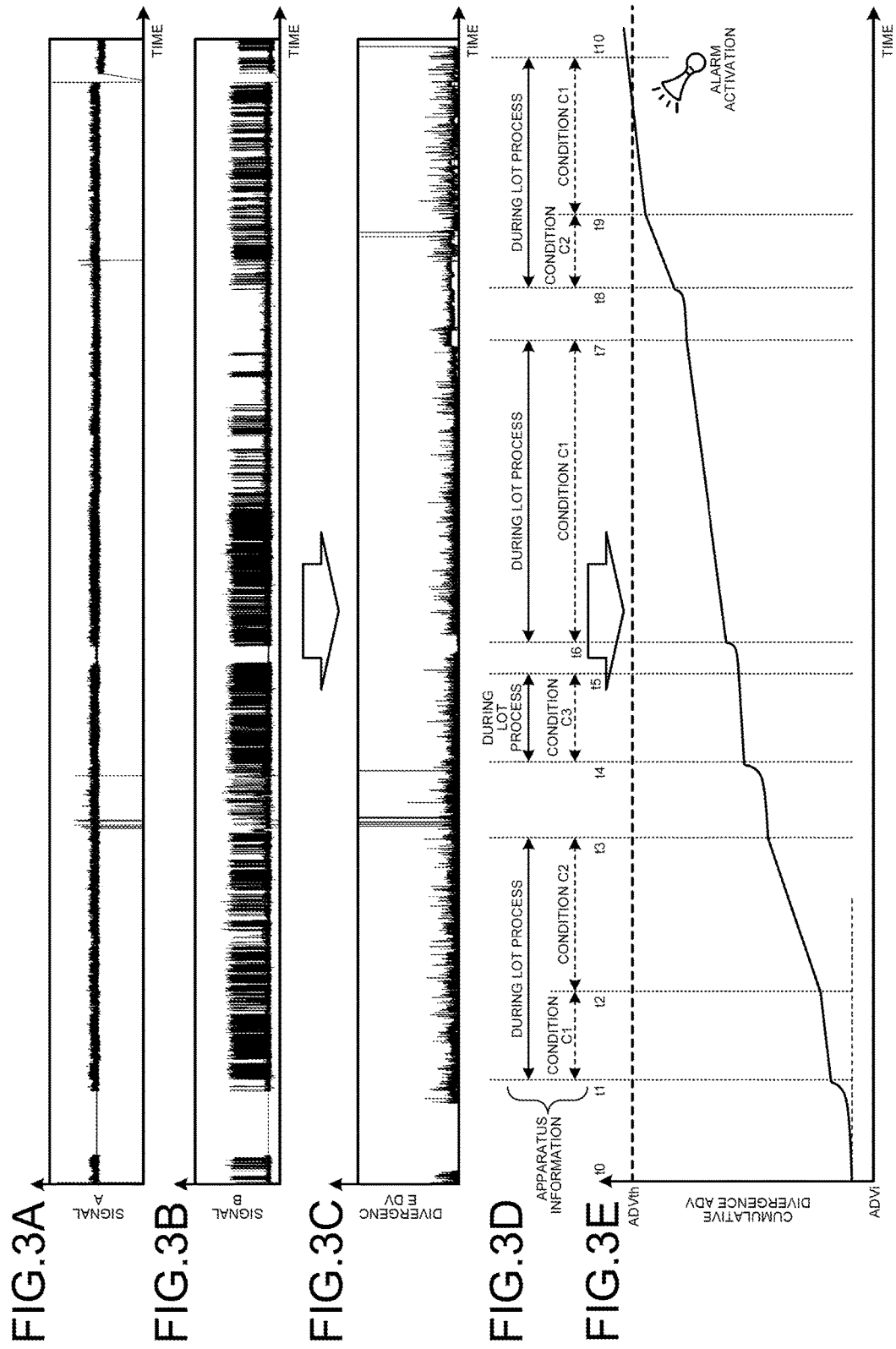
FIGS. 3A to 3E are waveform diagrams illustrating an operation of the anomaly detection system according to the first embodiment.

For example, the signal collecting unit 110 can collect a signal A (a signal indicating a case temperature of the main pump 22) illustrated in FIG. 3A from a sensor (a temperature sensor). FIG. 3A is a waveform diagram illustrating a time-dependent change in the signal A collected by the signal collecting unit 110, and a vertical axis denotes a signal level, and a horizontal axis denotes a time. The signal A repeatedly changes between a level corresponding to a normal state and a level corresponding to an abnormal state without showing a time-dependent change (for example, a change such as a monotonousness increase or a monotonousness decrease depending on time). The level corresponding to the normal state is a level that falls within a certain permissible level width. The level corresponding to the abnormal state is a level that falls outside the certain permissible level width.

The signal collecting unit 110 can collect a signal B (a signal indicating a primary current of the main pump 22) illustrated in FIG. 3B from a sensor (a current sensor). FIG. 3B is a waveform diagram illustrating a time-dependent change in the signal B collected by the signal collecting unit 110, and a vertical axis denotes a signal level, and a horizontal axis denotes a time. The signal B repeated changes between a level corresponding to the normal state and a level corresponding to the abnormal state without showing a time-dependent change (for example, a change such as a monotonousness increase or a monotonousness decrease). The level corresponding to the normal state is a level that falls within a certain permissible level width. The level corresponding to the abnormal state is a level that falls outside the certain permissible level width.

The signal collecting unit 110 supplies the plurality of types of collected parameters to the divergence calculating unit 120.

Figure 4:
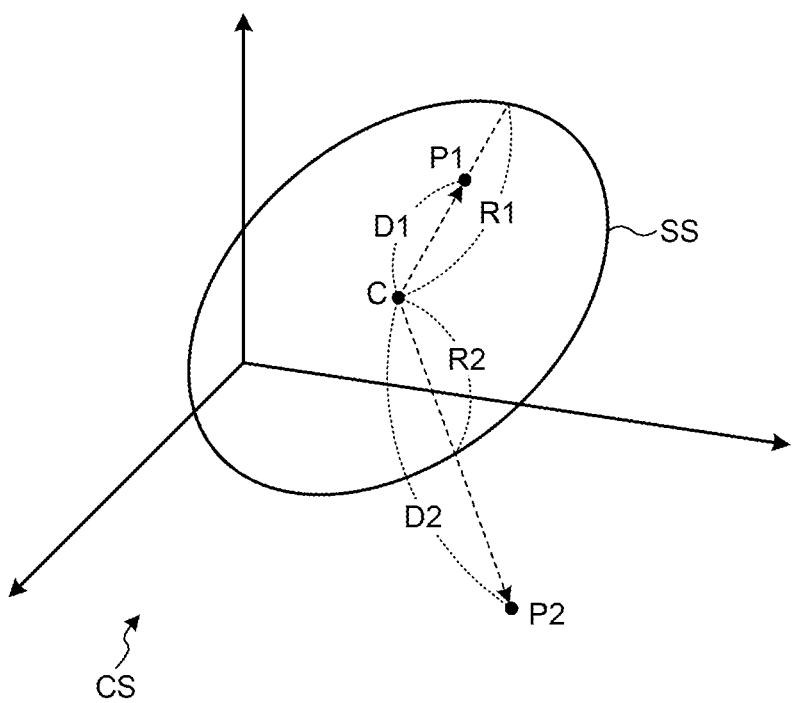
FIG. 4 is a diagram illustrating a virtual coordinate space and a reference space according to the first embodiment.

The divergence calculating unit 120 obtains divergences of the plurality of types of supplied parameters through the multivariate analysis. For example, the divergence calculating unit 120 calculates the divergences of the plurality of types of collected parameters using a virtual coordinate space CS and a reference space SS illustrated in FIG. 4. FIG. 4 is a diagram illustrating the virtual coordinate space CS and the reference space SS used for calculation of the divergence by the divergence calculating unit 120. The divergence calculating unit 120 can use, for example, a Mahalanobis-Taguchi technique as a multivariate analysis technique but may use any technique capable of calculating a divergence.

The virtual coordinate space CS is a coordinate space having a plurality of coordinate axes corresponding to feature quantities of the plurality of types of parameters. For example, when three types of parameters are supplied from the signal collecting unit 110, a three-dimensional coordinate space illustrated in FIG. 4 is used as the virtual coordinate space CS. The virtual coordinate space CS may be a two-dimensional coordinate space or a four or more dimensional coordinate space according to the number of types of parameters collected from the plurality of sensors installed in the auxiliary machine 20.

The reference space SS is a space that is arranged as a space indicating the normal state in the virtual coordinate space CS. In other words, information of the reference space SS is necessary for calculation of the divergence by the divergence calculating unit 120. The information of the reference space SS is stored in the reference space storage unit 180 that is determined in advance.

In order to calculate the divergence, the divergence calculating unit 120 access the reference space storage unit 180, and acquires the information of the reference space SS. The divergence calculating unit 120 generates the virtual coordinate space CS, and arranges the reference space SS indicating the normal state (the normal pattern) for the plurality of types of parameters in the virtual coordinate space CS. Then, the divergence calculating unit 120 extracts feature quantities on the plurality of types of parameters supplied from the signal collecting unit 110, that is, a plurality of types of parameters of an analysis target. The divergence calculating unit 120 arranges a coordinate point P including the plurality of extracted feature quantities as a coordinate value in the virtual coordinate space CS, and calculates the divergence of the coordinate point P from the reference space SS. Further, instead of extracting a plurality of feature quantities, the divergence calculating unit 120 may arrange a coordinate point P including raw values of a plurality of types of parameters as a coordinate value in the virtual coordinate space CS and calculate the divergence of the coordinate point P from the reference space SS.

More specifically, the divergence calculating unit 120 obtains a distance from a central point C of the reference space SS to the coordinate point P in the virtual coordinate space CS, and calculates a divergence of the coordinate point P from the reference space SS based on the calculated distance. For example, when the Mahalanobis-Taguchi technique is used, the divergence calculating unit 120 considers a correlation of the plurality of types of parameters (the shape of the reference space SS) as well in calculating the distances from the central point C of the reference space SS in the virtual coordinate space CS.

In other words, the divergence calculating unit 120 obtains coordinates of the central point C of the reference space SS in the virtual coordinate space CS. When the coordinate point for the plurality of types of parameters of the analysis target is P1, the divergence calculating unit 120 obtains a distance D1 of the coordinate point P1 from the central point C, and calculates D1/(R1) obtained by dividing the distance D1 by the diameter (the reference length) R1 of the reference space SS in a direction of a vector C→P1 as the divergence of the coordinate point P1. In this case, since the divergence (=D1/(R1)) of the coordinate point P1 is equal to or smaller than 1 (≤1), the coordinate point P1 can be understood to be fall within the reference space SS. As a result, the state of the auxiliary machine 20 corresponding to the coordinate point P1 can be estimated to be the normal state.

When the coordinate point for the plurality of types of parameters of the analysis target is P2, the divergence calculating unit 120 obtains a distance D2 of the coordinate point P2 from the central point C, and calculates D2/(R2) obtained by dividing the distance D2 by the diameter (the reference length) R2 of the reference space SS in a direction of a vector C→P2 as the divergence of the coordinate point P2. In this case, since the divergence (=D2/(R2)) of the coordinate point P2 is larger than 1 (>1), the coordinate point P2 can be understood to be fall outside the reference space SS. As a result, the state of the auxiliary machine 20 corresponding to the coordinate point P2 can be estimated to be the abnormal state. Further, as the divergence=D2/(R2) of the coordinate point P2 increases, the distance from the central point C of the reference space SS increases, and thus it is possible to estimate an abnormal degree of the state of the auxiliary machine 20 based on the magnitude of the divergence from the reference space SS.

It should be noted that, when O is assumed to be an original point of a coordinate system, a vector (third vector) of C→P2 can be obtained by subtracting a vector (a second vector of O→C from a vector (a first vector) of O→P2.

For example, the divergence calculating unit 120 calculates the divergence as illustrated in FIG. 3C. FIG. 3C illustrates a waveform indicating a time-dependent change in a divergence DV calculated by the divergence calculating unit 120, and a vertical axis denotes a level of the divergence DV, and a horizontal axis denotes a time. The divergence DV repeated changes between a level corresponding to the normal state and a level corresponding to the abnormal state without showing the time-dependent change (for example, a change such as a monotonousness increase or a monotonousness decrease). The level corresponding to the normal state is a level that is a reference value (for example, "1" in the case of the Mahalanobis-Taguchi technique) or less from a level "0." The level corresponding to the abnormal state is a level exceeding the reference value.

The divergence calculating unit 120 supplies the calculated divergence DV to the cumulative divergence calculating unit 130. Each time a plurality of types of parameters are supplied from the signal collecting unit 110, the divergence calculating unit 120 may supply the calculated divergence DV to the cumulative divergence calculating unit 130. Alternatively, the divergence calculating unit 120 may hold the calculated divergence DV and may supply the divergence DV to the cumulative divergence calculating unit 130 periodically (for example, with a sampling period).

The cumulative divergence calculating unit 130 holds an initial value ADVi as a value of a cumulative divergence ADV in an initial state. When the divergence DV is supplied from the divergence calculating unit 120, the cumulative divergence calculating unit 130 updates the cumulative divergence ADV from the initial value ADVi using the divergence DV calculated by the divergence calculating unit 120. In other words, the cumulative divergence calculating unit 130 calculates the cumulative divergence=ADV using the divergence DV calculated by the divergence calculating unit 120.

Here, since progress easiness of deterioration of the auxiliary machine 20 depends on influence (for example, an operational state, a processing condition, or the like) from the semiconductor manufacturing apparatus 10 (main machine), a mechanism of considering influence from the semiconductor manufacturing apparatus 10 (the main machine) when the cumulative divergence ADV is calculated by the cumulative divergence calculating unit 130 is necessary.

The information acquiring unit 160 acquires apparatus information related to the semiconductor manufacturing apparatus 10 (the main machine). The apparatus information may be held by an apparatus management host 30 that manages the semiconductor manufacturing apparatus 10 (the main machine), and the information acquiring unit 160 may acquire the apparatus information from the apparatus management host 30 via a wired or wireless communication line. Alternatively, the apparatus information may be held in the semiconductor manufacturing apparatus 10 (the main machine), and the information acquiring unit 160 may acquire the apparatus information from the semiconductor manufacturing apparatus 10 via a wired or wireless communication line. Further, the information acquiring unit 160 may acquire the apparatus information when a user inputs the apparatus information through the user I/F 50 (a keyboard 50a or a recording medium reading device 50c).

The apparatus information is information related to at least one of the operational state and the processing condition of the semiconductor manufacturing apparatus 10 (the main machine). The operational state may include a state indicating whether the semiconductor manufacturing apparatus 10 is in an in-process state (a "process" state) or a non-process state (an "idle" state) in real time. The processing condition is a condition indicating a condition under which processing is being performed by the semiconductor manufacturing apparatus 10 in real time. Examples of the processing condition of the semiconductor manufacturing apparatus 10 include a gas flow rate of each gas type supplied to the vacuum chamber 10a, pressure of the vacuum chamber 10a, a temperature of a stage on which a substrate to be processed is placed in the vacuum chamber 10a, and power used for processing in the vacuum chamber 10a.

For example, the information acquiring unit 160 may acquire the apparatus information illustrated in FIG. 3D from the apparatus management host 30 and/or the semiconductor manufacturing apparatus 10. FIG. 3D is a diagram illustrating content of the apparatus information acquired by the information acquiring unit 160, and a horizontal axis denotes a time. In the example illustrated in FIG. 3D, the apparatus information includes information indicating that the operational state is the in-process state (the "process" state) in each period of time of timings t1 to t3, t4 to t5, t6 to t7, and t8 to t10 and information indicating that the operational state is the non-process state (the "idle" state) in each period of time of timings t0 to t1, t3 to t4, t5 to t6, and t7 to t8. The apparatus information includes information indicating that processing is performed under a condition C1 in each period of time of timings t1 to t2, t6 to t7, and t9 to t10, information indicating that processing is performed under a condition C2 in each period of time of timings t2 to t3 and t8 to t9, and information indicating that processing is performed under a condition C3 in each period of time of timings t4 to t5.

The information acquiring unit 160 supplies the acquired apparatus information to the cumulative condition setting unit 170.

The cumulative condition setting unit 170 sets a cumulative condition used to calculate the cumulative divergence ADV the cumulative divergence calculating unit 130 according to the apparatus information. The cumulative condition setting unit 170 sets a weight used when the divergence DV is added to the cumulative divergence ADV in the cumulative divergence calculating unit 130 according to the apparatus information. In other words, the cumulative condition setting unit 170 obtains a weight coefficient according to the apparatus information which is applied to the divergence DV through the cumulative divergence calculating unit 130.

For example, when the auxiliary machine 20 is found to deteriorate in the non-process state (the "idle" state) of the semiconductor manufacturing apparatus 10 more easily than the in-process state (the "process" state) of the semiconductor manufacturing apparatus 10, the cumulative condition setting unit 170 sets the weight coefficient for the in-process state (the "process" state) to Wp, and sets the weight coefficient for the non-process state (the "idle" state) to Wi (>Wp). In other words, the cumulative condition setting unit 170 sets the weight coefficient that is applied to the divergence DV of each period of time of the timings t1 to t3, t4 to t5, t6 to t7, and t8 to t10 and the weight coefficient that is applied to the divergence DV of each period of time of the timings t0 to t1, t3 to t4, t5 to t6, and t7 to t8 to Wp and Wi, respectively, according to the apparatus information.

Further, when the progress easiness of deterioration of the auxiliary machine 20 is found to have a relation of the condition C3<the condition C1<the condition C2, the cumulative condition setting unit 170 sets the weight coefficient for the condition C3 to Wc3, sets the weight coefficient for the condition C1 to Wc1 (>Wc3), and sets the weight coefficient for the condition C2 to Wc2 (>Wc3, >Wc1). In other words, the cumulative condition setting unit 170 sets the weight coefficient for the period of time of the timing t4 to t5, the weight coefficient for each period of time of the timings t1 to t2, t6 to t7, and t9 to t10, and the weight coefficient for each period of time of the timings t2 to t3 and t8 to t9 to Wc3, Wc1, and Wc2, respectively, according to the apparatus information.

The cumulative condition setting unit 170 may set the weight coefficients interactively according to the user's operation performed through the user I/F 50 (the keyboard 50a or the recording medium reading device 50c). Alternatively, the cumulative condition setting unit 170 may set the weight coefficients without the interactive operation performed by the above method as the user inputs candidates of the weight coefficients through the user I/F 50 (the keyboard 50a or the recording medium reading device 50c). The cumulative condition setting unit 170 holds the set weight coefficients, and notifies the cumulative divergence calculating unit 130 of the set weight coefficients.

When the divergence DV is supplied from the divergence calculating unit 120, the cumulative divergence calculating unit 130 updates the cumulative divergence ADV by multiplying the divergence DV by the weight coefficient notified from the cumulative condition setting unit 170 and adding the divergence DV obtained by multiplying by the weight coefficient to the initial value ADVi. Thereafter, each time the divergence DV is supplied from the divergence calculating unit 120, the cumulative divergence calculating unit 130 updates the cumulative divergence ADV by multiplying the divergence DV by the weight coefficient notified from the cumulative condition setting unit 170 and adding the divergence DV obtained by multiplying by the weight coefficient to the value of the cumulative divergence ADV.

For example, the cumulative divergence calculating unit 130 updates the cumulative divergence ADV by adding the value obtained by 'the divergence DV'×'the weight coefficient Wi' to the value of the cumulative divergence ADV in each period of time of the timings t0 to t1, t3 to t4, t5 to t6, and t7 to t8. The cumulative divergence calculating unit 130 the cumulative divergence ADV by multiplying 'the value obtained by the divergence DV'×'the weight coefficient Wp'×'the weight coefficient Wc3' to the value of the cumulative divergence ADV in the period of time of the timings t4 to t5. The cumulative divergence calculating unit 130 updates the cumulative divergence ADV by adding 'the value obtained by the divergence DV'×'the weight coefficient Wp'×'the weight coefficient Wc1' to the value of the cumulative divergence ADV in each period of time of the timings t1 to t2, t6 to t7, and t9 to t10. The cumulative divergence calculating unit 130 updates the cumulative divergence ADV by adding 'the value obtained by the divergence DV'×'the weight coefficient Wp'×'the weight coefficient Wc2' to the value of the cumulative divergence ADV in each period of time of the timings t2 to t3 and t8 to t9. As a result, the cumulative divergence calculating unit 130 can calculate the cumulative divergence ADV such that the cumulative divergence ADV is increased by the weights that cause the relation of the in-process state (the "process" state)<the non-process state (the "idle" state) and the relation of the condition C3<the condition C1<the condition C2 to be reflected on the progress easiness of deterioration of the auxiliary machine 20 as illustrated in FIG. 3E. FIG. 3E is a diagram illustrating a time-dependent change in the cumulative divergence ADV calculated by the cumulative divergence calculating unit 130, and a vertical axis denotes the magnitude of the cumulative divergence ADV, and a horizontal axis denotes a time.

Here, since the progress easiness of deterioration of the auxiliary machine 20 depends on the individual difference of the auxiliary machine 20, a mechanism of considering the individual difference of the auxiliary machine 20 when the cumulative divergence ADV is calculated by the cumulative divergence calculating unit 130 is necessary. The individual difference of the auxiliary machine 20 includes a difference between when the auxiliary machine 20 is in a new state in which the maintenance has recently performed and when the auxiliary machine 20 is in an old state in which a reference period of time or more has elapsed after the maintenance.

The information acquiring unit 160 acquires maintenance history information of the auxiliary machine 20. The maintenance history information is stored in a facility maintenance history database 40 each time the maintenance (a maintenance, a repair, and the like) of the auxiliary machine 20 is performed, and the information acquiring unit 160 can acquire the maintenance history information from the facility maintenance history database 40 via a wired or wireless communication line. Further, the information acquiring unit 160 may acquire the maintenance history information when the user inputs the maintenance history information through the user I/F 50 (the keyboard 50a or the recording medium reading device 50c). The maintenance history information is information indicating when the maintenance of the auxiliary machine 20 has been performed. The information acquiring unit 160 supplies the acquired maintenance history information to the cumulative condition setting unit 170.

The cumulative condition setting unit 170 sets the initial value of the cumulative divergence according to the maintenance history information. The cumulative condition setting unit 170 obtains an elapsed period of time after the most recent maintenance of the auxiliary machine 20 has been performed according to the maintenance history information. The cumulative condition setting unit 170 compares the obtained elapsed period of time with the reference period of time, and sets the initial value of the cumulative divergence according to a comparison result. For example, when the elapsed period of time is less than the reference period of time, the cumulative condition setting unit 170 sets the initial value ADVi of the cumulative divergence to an initial value ADVi1 (for example, a value equivalent to about 0) for the new state. When the elapsed period of time is the reference period of time or larger, the cumulative condition setting unit 170 sets the initial value ADVi of the cumulative divergence to an initial value ADVi2 (>ADVi1, for example, a value larger than 0) for the old state.

The cumulative condition setting unit 170 may interactively set the initial value according to the user's operation performed through the user I/F 50 (the keyboard 50a or the recording medium reading device 50c). Alternatively, the cumulative condition setting unit 170 may set the initial value without the interactive operation performed by the above method as the user inputs candidates of the initial value through the user I/F 50 (the keyboard 50a or the recording medium reading device 50c). The cumulative condition setting unit 170 holds the set initial value, and notifies the cumulative divergence calculating unit 130 of the set initial value.

The cumulative divergence calculating unit 130 holds the notified initial value as the initial value ADVi of the cumulative divergence ADV. When the divergence DV is supplied from the divergence calculating unit 120, the cumulative divergence calculating unit 130 updates the cumulative divergence ADV by multiplying the divergence DV by the weight coefficient notified from the cumulative condition setting unit 170 and adding the divergence DV obtained by multiplying by the weight coefficient to the initial value ADVi. Thereafter, each time the divergence DV is supplied from the divergence calculating unit 120, the cumulative divergence calculating unit 130 updates the cumulative divergence ADV by multiplying the divergence DV by the weight coefficient notified from the cumulative condition setting unit 170 and adding the divergence DV obtained by multiplying by the weight coefficient to the value of the cumulative divergence ADV. As a result, the cumulative divergence calculating unit 130 can calculate the cumulative divergence ADV such that the cumulative divergence ADV is increased from the initial value ADVi that causes the relation of the new state<the old state to be reflected on the progress easiness of deterioration of the auxiliary machine 20 as illustrated in FIG. 3E.

The cumulative divergence calculating unit 130 supplies the calculated cumulative divergence ADV to the calculation result determining unit 140.

The alarm activation condition setting unit 150 sets an alarm activation condition for activating an alarm and a threshold value ADVth serving as a criterion of the alarm activation condition. The alarm activation condition may be set such that the cumulative divergence ADV is the threshold value ADVth or larger. For example, the threshold value ADVth may be set using a cumulative divergence value of a certain period of time including a time zone in which the auxiliary machine 20 (the dry pump) is normally operated and a target lifespan or an average lifespan. Further, the threshold value ADVth can be set by any method as long as it serves as the criterion of the alarm activation condition for activating an alarm.

The alarm activation condition setting unit 150 may interactively set the threshold value ADVth according to the user's operation performed by the user I/F 50 (the keyboard 50a or the recording medium reading device 50c). The alarm activation condition setting unit 150 holds the set alarm activation condition and the threshold value ADVth, and notifies the calculation result determining unit 140 of the set alarm activation condition and the threshold value ADVth.

The calculation result determining unit 140 compares the cumulative divergence ADV with the threshold value ADVth, and determines an anomaly in the auxiliary machine 20 according to a comparison result and the alarm activation condition. When the cumulative divergence ADV is less than the threshold value ADVth, the calculation result determining unit 140 determines that the deterioration progress of the auxiliary machine 20 has not reached the abnormal level and does not give an instruction to active an alarm. When the cumulative divergence ADV is the threshold value ADVth or larger, the calculation result determining unit 140 determines that the deterioration progress of the auxiliary machine 20 has reached the abnormal level and gives an instruction to activate an alarm.

When the instruction to activate an alarm is given, the anomaly detection system 100 activates an alarm toward the user. The alarm activation may be performed by a visual device or an auditory device. For example, the visual device may display an error message on a display 50b of the user I/F 50 or may turn on or off an alarm lamp. For example, the auditory device may output an error message sound through a speaker 50d of the user I/F 50 or may sound a buzzer. As a result, the user can recognize that the failure time of the auxiliary machine 20 is close, and thus it is possible to urge the user to perform the maintenance of the auxiliary machine 20.

Figure 5:
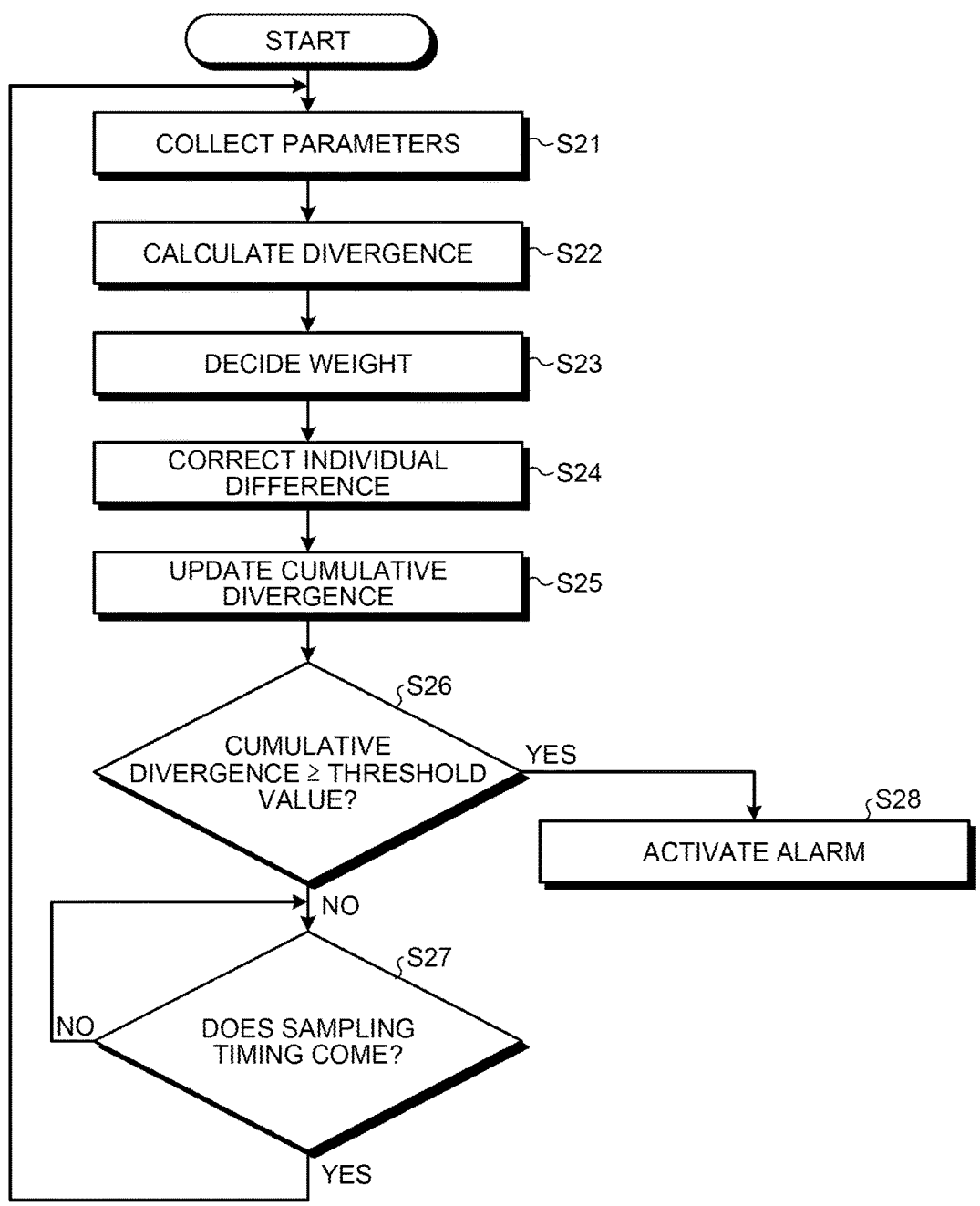
FIG. 5 is a flowchart illustrating an operation of the anomaly detection system according to the first embodiment.

Next, an operation of the anomaly detection system 100 will be described with reference to FIG. 5. FIG. 5 is a flowchart illustrating an operation of the anomaly detection system 100.

The anomaly detection system 100 collects a plurality of types of parameters related to the state of the auxiliary machine 20 (S21). The anomaly detection system 100 extracts feature quantities on the plurality of types of parameters, that is, a plurality of types of parameters of an analysis target. The anomaly detection system 100 arranges the coordinate point P including the plurality of extracted feature quantities as a coordinate value in the virtual coordinate space CS, and calculates the divergence of the coordinate point P from the reference space SS (S22). Further, instead of extracting a plurality of feature quantities, the divergence calculating unit 120 may arrange the coordinate point P including raw values of a plurality of types of parameters as a coordinate value in the virtual coordinate space CS and calculate the divergence of the coordinate point P from the reference space SS.

The anomaly detection system 100 acquires the apparatus information related to at least one of the operational state, the operational schedule, the processing condition, and processing schedule of the semiconductor manufacturing apparatus 10 (the main machine). The anomaly detection system 100 sets a weight used when the divergence DV is added to the cumulative divergence ADV according to the apparatus information. In other words, the anomaly detection system 100 obtains the weight coefficient according to the apparatus information which is applied to the divergence DV (S23).

The anomaly detection system 100 acquires the maintenance history information of the auxiliary machine 20. The anomaly detection system 100 obtains an elapsed period of time after the most recent maintenance of the auxiliary machine 20 has been performed according to the maintenance history information of the auxiliary machine 20. The anomaly detection system 100 compares the obtained elapsed period of time with the reference period of time, and sets the initial value of the cumulative divergence according to a comparison result. In other words, the anomaly detection system 100 corrects the individual difference of the auxiliary machine 20 by setting the initial value ADVi that causes the relation of the new state<the old state to be reflected on the progress easiness of deterioration of the auxiliary machine 20 (S24).

In a first loop process, the anomaly detection system 100 updates the cumulative divergence ADV by multiplying the divergence DV calculated in S22 by the weight coefficient decided in S23 and adding the divergence DV obtained by multiplying by the weight coefficient to the initial value ADVi set in S24. In a second or later loop process, the anomaly detection system 100 updates the cumulative divergence ADV by multiplying the divergence DV calculated in S22 by the weight coefficient decided in S23 and adding the divergence DV obtained by multiplying by the weight coefficient to the value of the cumulative divergence ADV most recently updated in S25 (S25).

The anomaly detection system 100 compares the cumulative divergence ADV with the threshold value ADVth, and determines an anomaly in the auxiliary machine 20 according to the comparison result and the alarm activation condition (S26). When the cumulative divergence ADV is less than the threshold value ADVth (No in S26), the anomaly detection system 100 determines that the deterioration progress of the auxiliary machine 20 has not reached the abnormal level, and the process proceeds to S27. The anomaly detection system 100 is on standby until a next sampling timing comes (No in S27), and when a sampling timing comes (Yes in S27), the process returns to S21. As a result, the loop process of S21 to S27 is repeated until the cumulative divergence ADV becomes the threshold value ADVth or larger.

When the cumulative divergence ADV is the threshold value ADVth or larger (Yes in S26), the anomaly detection system 100 determines that the deterioration progress of the auxiliary machine 20 has reached the abnormal level, and the process proceeds to S28. When an instruction to active an alarm is given, the anomaly detection system 100 activates an alarm toward the user (S28).

As described above, in the first embodiment, in the anomaly detection system 100, the cumulative divergence calculating unit 130 calculates the cumulative divergence using the divergence calculated by the divergence calculating unit 120, and the calculation result determining unit 140 compares the cumulative divergence calculated by the cumulative divergence calculating unit 130 with the threshold value, and determines an anomaly in the auxiliary machine 20. Thus, it is possible to quantitatively understand the progress of deterioration accumulated in the auxiliary machine 20 based on the cumulative divergence, and it is possible to monitor the progress of deterioration accumulated in the auxiliary machine 20 by comparing the cumulative divergence with the threshold value. As a result, it is possible to perform anomaly detection and failure anticipation on the auxiliary machine 20 in which the time-dependent change (for example, a change such as a monotonousness increase or a monotonousness decrease) is not seen in the acquired signal level, and it is possible to improve the accuracy of anomaly detection and failure anticipation.

Further, in the first embodiment, in the anomaly detection system 100, the information acquiring unit 160 acquires the apparatus information related to at least one of the operational state, operational schedule, the processing condition, and the processing schedule of the semiconductor manufacturing apparatus 10, and the cumulative divergence calculating unit 130 adds the divergence calculated by the divergence calculating unit 120 to the cumulative divergence using the weight according to the apparatus information. As a result, it is possible to calculate the cumulative divergence while considering the dynamic change in the progress easiness of deterioration of the auxiliary machine 20 according to the influence (the operational state, the processing condition, or the like) from the semiconductor manufacturing apparatus 10, and thus it is possible to improve the accuracy of anomaly detection and failure anticipation on the auxiliary machine 20.

Further, in the first embodiment, in the anomaly detection system 100, the alarm activation condition setting unit 150 sets the initial value of the cumulative divergence according to the maintenance history information of the auxiliary machine 20. As a result, it is possible to calculate the cumulative divergence while considering the difference in the progress easiness of deterioration of the auxiliary machine 20 according to the individual difference of the auxiliary machine 20, and thus it is possible to improve the accuracy of anomaly detection and failure anticipation on the auxiliary machine 20.

Further, a degree of deterioration at a current point in time by the maintenance history information of the auxiliary machine 20 can be used for a setting of the weight coefficient indicating the progress easiness of deterioration. Instead of or in addition to setting the initial value of the cumulative divergence according to the maintenance history information, the cumulative condition setting unit 170 may set a weight used when the cumulative divergence calculating unit 130 adds the divergence DV to the cumulative divergence ADV.

When it is understood that the progress easiness of deterioration of the auxiliary machine 20 is in the relation of the new state<the old state, the cumulative condition setting unit 170 sets the weight coefficient for the new state to Wnew, and sets the weight coefficient for the old state to Wold (>Wnew). The cumulative condition setting unit 170 notifies the cumulative divergence calculating unit 130 of the set weight coefficient.

When the divergence DV is supplied from the divergence calculating unit 120, the cumulative divergence calculating unit 130 updates the cumulative divergence ADV by multiplying the divergence DV by the weight coefficient notified from the cumulative condition setting unit 170 and adding the divergence DV obtained by multiplying by the weight coefficient to the initial value ADVi. Thereafter, each time the divergence DV is supplied from the divergence calculating unit 120, the cumulative divergence calculating unit 130 updates the cumulative divergence ADV by multiplying the divergence DV by the weight coefficient notified from the cumulative condition setting unit 170 and adding the divergence DV obtained by multiplying by the weight coefficient to the value of the cumulative divergence ADV. As a result, the cumulative divergence calculating unit 130 can calculate the cumulative divergence ADV such that the cumulative divergence ADV is increased by the weight that causes the relation of the new state<the old state to be reflected on the progress easiness of deterioration of the auxiliary machine 20 as illustrated in FIG. 3E.

Alternatively, the degree of deterioration at a current point in time by the maintenance history information of the auxiliary machine 20 can be used for a setting of the threshold value ADVth used for anomaly determination. Instead of or in addition to setting the initial value of the cumulative divergence according to the maintenance history information of the auxiliary machine 20, the alarm activation condition setting unit 150 may set the threshold value ADVth.

In other words, the alarm activation condition setting unit 150 obtains the elapsed period of time after the most recent maintenance of the auxiliary machine 20 has been performed according to the maintenance history information. The alarm activation condition setting unit 150 compares the obtained elapsed period of time with the reference period of time, and sets the threshold value ADVth according to the comparison result. For example, when the elapsed period of time is less than the reference period of time, the alarm activation condition setting unit 150 sets the threshold value ADVth as a threshold value ADVth1 for the new state. When the elapsed period of time is the reference period of time or larger, the cumulative condition setting unit 170 sets the threshold value ADVth as a threshold value ADVth2 (<ADVth1) for the old state. The alarm activation condition setting unit 150 notifies the calculation result determining unit 140 of the set threshold value ADVth.

The calculation result determining unit 140 compares the cumulative divergence ADV with the notified threshold value ADVth, and determines an anomaly in the auxiliary machine 20 according to the comparison result and the alarm activation condition. As the notified threshold value ADVth, the threshold value ADVth2 for the old state is lower than the threshold value ADVth1 for the new state. As a result, the calculation result determining unit 140 can determine an anomaly using the threshold value ADVth that causes the relation of 'the new state'<'the old state' to be reflected on the progress easiness of deterioration of the auxiliary machine 20 as illustrated in FIG. 3E.

(Second Embodiment)

Next, an anomaly detection system 200 according to the second embodiment will be described. The following description will proceed focusing on a portion different from the first embodiment.

In the first embodiment, a way of deciding the reference space SS (see FIG. 4) necessary for a calculation of the divergence by the divergence calculating unit 120 is not particularly limited.

It is assumed that a method of creating the reference space SS using "signal data when a product determined to be a non-defective product in an inspection result is produced" or "signal data of a certain period of time directly after the auxiliary machine 20 is maintained" as sample data is considered. This method is based on a concept in which signal data when a non-defective product is produced or directly after a maintenance work can create a reference space having a small variation and a good accuracy.

However, when the reference space is created using the signal data "when a non-defective product is produced," it is difficult to obtain sample data used to create the reference space until a workmanship inspection result after a product is produced is obtained. In addition, when signal data at a normal time changes by the individual difference of the auxiliary machine 20, the processing condition of the semiconductor manufacturing apparatus 10, or the like, it is necessary to create the reference space SS each time. Thus, a monitoring start timing for anomaly detection or failure anticipation of the auxiliary machine 20 tends to be delayed.

Further, as in the auxiliary machine 20 (for example, the vacuum pump) incidental to the semiconductor manufacturing apparatus 10, even when the semiconductor manufacturing apparatus 10 produces the non-defective product or even directly after the auxiliary machine 20 is maintained, it is not guaranteed that the abnormal state serving as a failure cause does not occur in the auxiliary machine 20. Thus, even when the reference space is created using the signal data "when a non-defective product is produced" or "directly after the auxiliary machine 20 is maintained" simply, the created reference space is unlikely to indicate the normal state of the auxiliary machine 20 exactly. When the accuracy of creating the reference space decreases, the normality/anomaly determination accuracy performed by comparing the cumulative divergence ADV with the threshold value ADVth is likely to decrease as well.

In this regard, in the second embodiment, the accuracy of creating the reference space is improved without delaying the monitoring start by collecting a plurality of types of parameters in a plurality of different time zones, calculating statistics of the plurality of types of parameters in each time zone, extracting statistics (upper side statistics in which a statistic is good) satisfying an extraction rule, and creating the reference space using a plurality of types of parameters corresponding to the extracted statistics.

Figure 6:
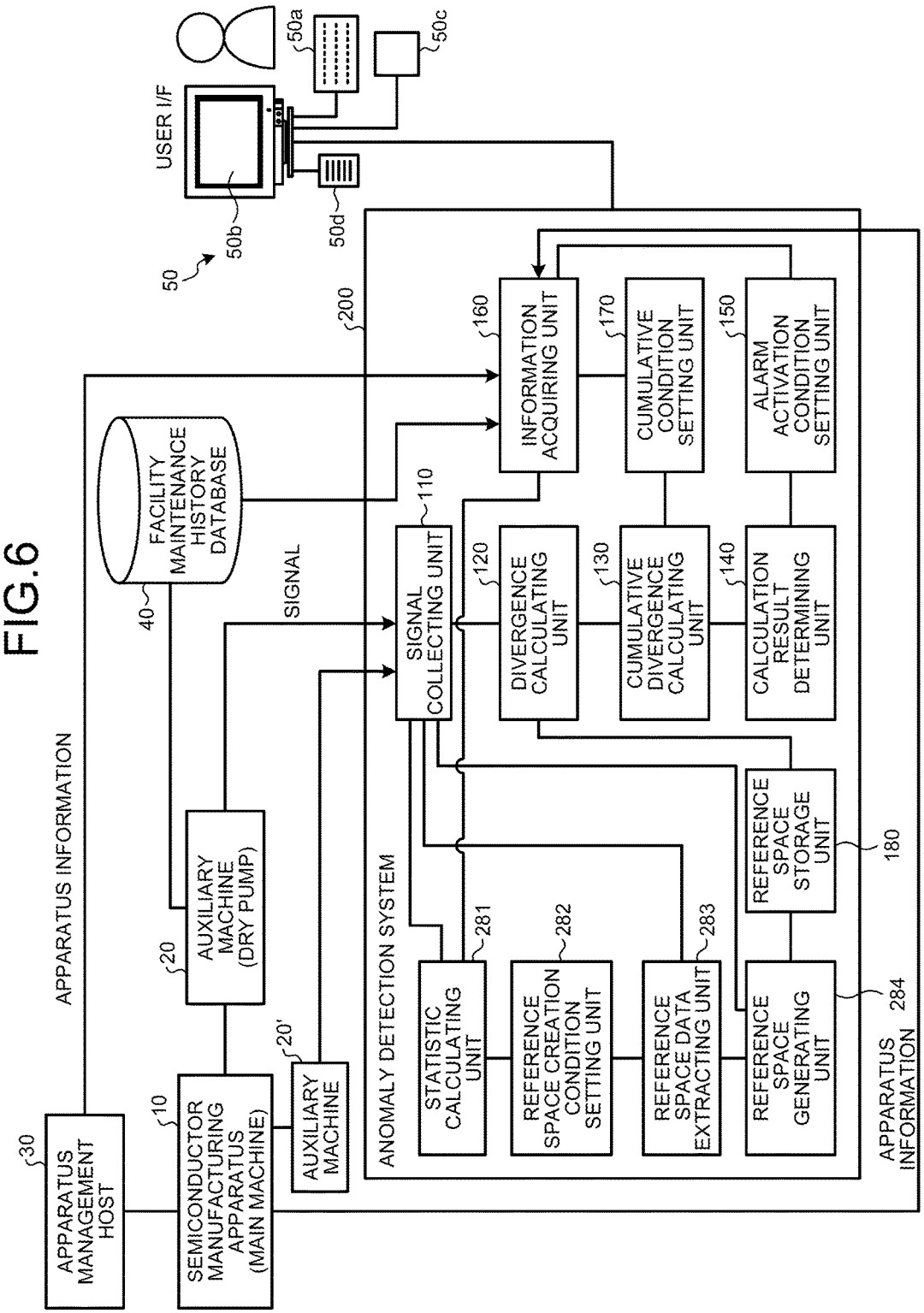
FIG. 6 is a diagram illustrating a configuration of an anomaly detection system according to a second embodiment.

Specifically, an anomaly detection system 200 includes a statistic calculating unit 281, a reference space creation condition setting unit 282, a reference space data extracting unit 283, and a reference space generating unit 284 as illustrated in FIG. 6. FIG. 6 is a diagram illustrating a configuration of the anomaly detection system 200.

Figure 7:
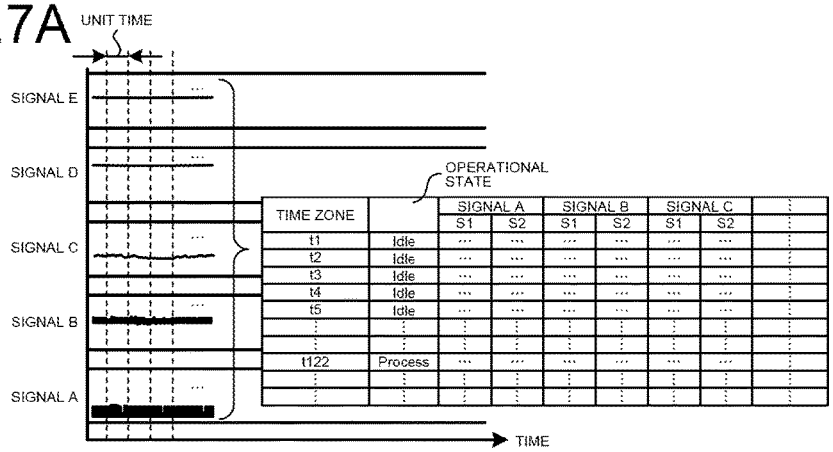
FIGS. 7A to 7F are diagrams illustrating an operation of the anomaly detection system according to the second embodiment.

The statistic calculating unit 281 receives a plurality of types of parameters collected in a plurality of different time zones by the signal collecting unit 110. The statistic calculating unit 281 calculates basic statistics of the respective time zones for a plurality of types of parameters (a plurality of types of signals). For example, as illustrated in FIG. 7A, the statistic calculating unit 281 calculates the basic statistics (for example, a first statistic s1 ad a second statistic s2) of the respective time zones for signals A, B, C, etc. The first statistic s1 is obtained by performing a statistical process on a plurality of values of a target parameter in a time zone of interest through a first statistical technique. For example, the first statistical technique obtains an average value of a plurality of values, but any other statistical technique may be used. The second statistic s2 is obtained by performing a statistical process on a plurality of values of a target parameter in a time zone of interest by a second statistical technique. The second statistical technique may be different from the first statistical technique. For example, the second statistical technique obtains a dispersion of a plurality of values, but any other statistical technique may be used.

Then, the statistic calculating unit 281 classifies the time zones according to the operational state of the semiconductor manufacturing apparatus 10 (the main machine) using the calculated basic statistics (for example, the first statistic s1 and the second statistic s2) as illustrated in FIGS. 7B and 7C. The operational state of the semiconductor manufacturing apparatus 10 (the main machine) preferably includes a state that can be used for creation of the reference space, and includes, for example, the in-process state and the idle state but may include any other state. Further, the statistic calculating unit 281 obtains parameters X (=f(s1, s2)) obtained from the basic statistics for each operational state of the semiconductor manufacturing apparatus 10 (the main machine) as illustrated in FIGS. 7D and 7E. The parameters X are parameters that are obtained by performing a certain operation on the basic statistics (for example, the first statistic s1 and the second statistic s2) and serve as an index indicating a distribution state of a plurality of values, for example. Then, the statistic calculating unit 281 sorts the time zones based on the values of the parameters X for each operational state of the semiconductor manufacturing apparatus 10 (the main machine). For example, the statistic calculating unit 281 performs the sorting in the descending order of the values of the parameters X.

The reference space creation condition setting unit 282 sets a specified sample number necessary for creation of the reference space SS (see FIG. 4). The reference space creation condition setting unit 282 notifies the reference space data extracting unit 283 of the set specified sample number.

The reference space data extracting unit 283 acquires the data sorted for each operational state of the semiconductor manufacturing apparatus 10 (the main machine) by the statistic calculating unit 281 through the signal collecting unit 110. The reference space data extracting unit 283 determines that it becomes a state in which the number of samples necessary for creation of the reference space SS can be extracted when the number of samples of the data sorted for ach operational state of the semiconductor manufacturing apparatus 10 (the main machine) has reached the specified sample number. In this state, the reference space data extracting unit 283 extracts statistics (upper side statistics) satisfying an extraction rule among the statistics of a plurality of time zones of each operational state of the semiconductor manufacturing apparatus 10 (the main machine) as indicated by thick lines in FIGS. 7D and 7E. The reference space data extracting unit 283 supplies a plurality of types of parameters (for example, raw values of respective signals or feature quantities of respective signals) of the time zones corresponding to the extracted upper side statistics of each operational state of the semiconductor manufacturing apparatus 10 (the main machine) to the reference space generating unit 284.

The reference space generating unit 284 generates the reference space SS using the plurality of types of parameters of the time zones corresponding to the extracted upper side statistics. For example, the reference space generating unit 284 generates the reference space SS using the plurality of types of parameters of each operational state of the semiconductor manufacturing apparatus 10 (the main machine). For example, the reference space generating unit 284 merges the plurality of types of parameters of the respective operational states according to a certain rule. Then, the reference space generating unit 284 generates the reference space SS using a plurality of types of merged parameters (see FIG. 7F). For example, the reference space generating unit 284 generates a minimum consecutive space including the plurality of types of parameters corresponding to the upper side statistics extracted within the virtual coordinate space CS as the reference space SS. The reference space generating unit 284 stores the generated reference space SS in the reference space storage unit 180. As a result, the divergence calculating unit 120 can start to calculate the divergence, and the anomaly detection system 200 can start to monitor the progress of deterioration accumulated in the auxiliary machine 20.

Further, the anomaly detection system 200 is provided with a reference space learning function in order to improve the normality/anomaly determination accuracy. In other words, when an elapsed period of time after the anomaly detection system 200 started the monitoring is within a reference space learning period of time, the statistic calculating unit 281, the reference space creation condition setting unit 282, the reference space data extracting unit 283, and the reference space generating unit 284 perform the above-described operation. At this time, the reference space creation condition setting unit 282 sets the reference space learning period of time, and notifies the reference space generating unit 284 of the reference space learning period of time. Thus, during the reference space learning period of time, it is possible to repeatedly update the reference space SS, and it is possible to gradually improve the accuracy of the generated reference space SS.

Figure 8:
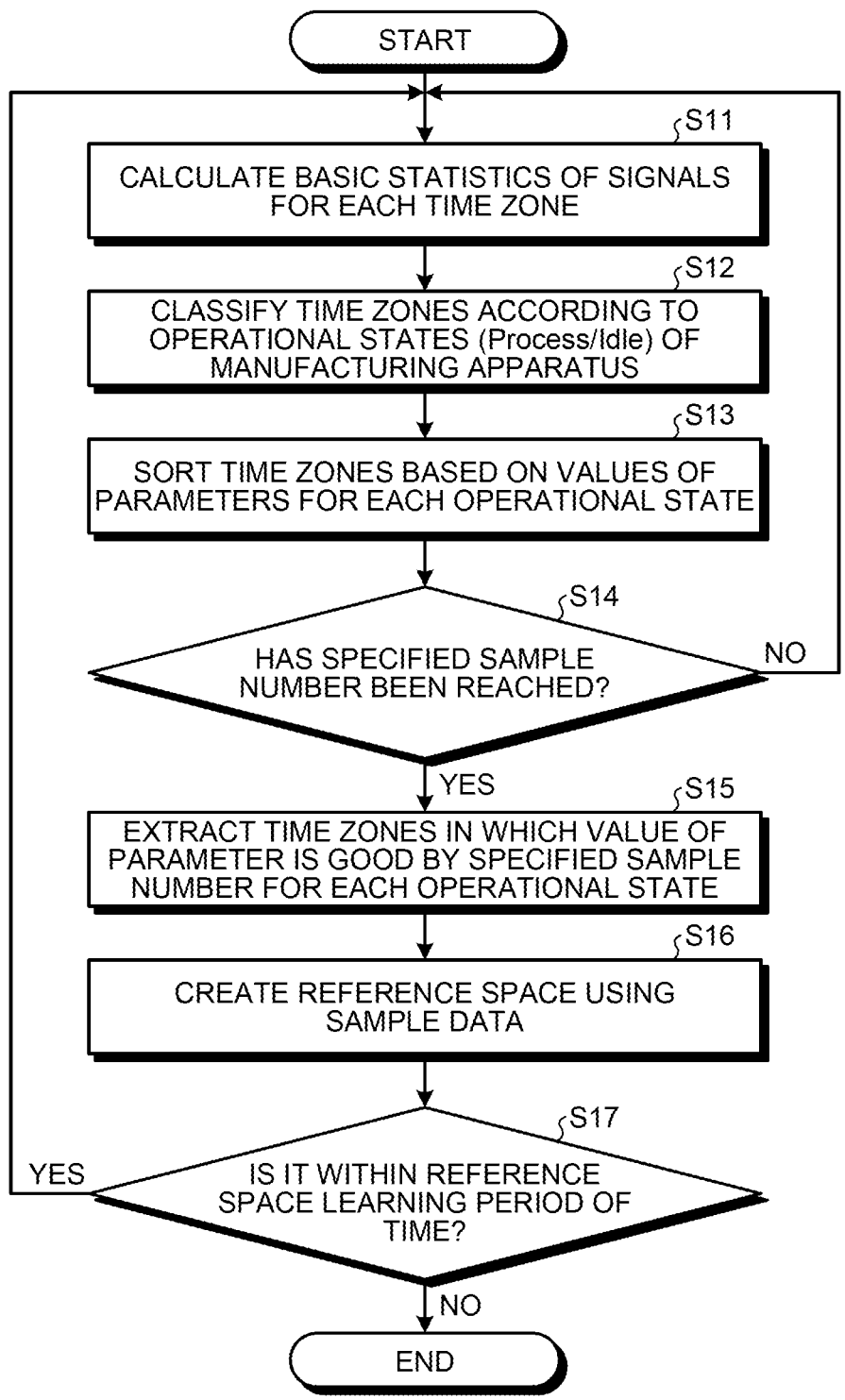
FIG. 8 is a flowchart illustrating an operation of the anomaly detection system according to the second embodiment.

In an operation of the anomaly detection system 200, processing different from that of the first embodiment is performed in the following points as illustrated in FIG. 8. FIG. 8 is a flowchart illustrating an operation of the anomaly detection system 200, focusing on the creation of the reference space SS.

The anomaly detection system 200 starts to acquire a plurality of types of parameters (a plurality of types of signals) directly after the auxiliary machine 20 (the vacuum pump) is mounted in the semiconductor manufacturing apparatus 10. The anomaly detection system 200 calculates basic statistics of all signals for each time zone in parallel with the signal data acquisition (S11). Since a value of the signal data when the auxiliary machine 20 (the vacuum pump) is normally operated differs according to the operational state of the semiconductor manufacturing apparatus 10, the anomaly detection system 200 classifies the time zones in which the basic statistic is calculated according to the operational states (for example, the in-process state and the idle state) of the semiconductor manufacturing apparatus (S12). The anomaly detection system 200 obtains the parameters X (=f(s1, s2)) obtained from the basic statistics for each operational state of the semiconductor manufacturing apparatus 10 (the main machine). The anomaly detection system 200 sorts the time zones based on the values of the parameters X for each operational state of the semiconductor manufacturing apparatus 10 (the main machine) (S13). For example, the anomaly detection system 200 performs the sorting in the descending order of the values of the parameters X.

The anomaly detection system 200 repeats the process of S11 to S13 until the "specified sample number" necessary for creation of the reference space is reached (No in S14). When the number of samples of data sorted for each operational state reaches the specified sample number (Yes in S14), the anomaly detection system 200 extracts the time zones in which the value of the parameter X is good by the specified sample number for each operational state (S15). The anomaly detection system 200 merges the plurality of types of parameters of the respective operational states according to a certain rule. Then, the reference space generating unit 284 generates the reference space SS using a plurality of types of merged parameters (S16). Thereafter, the auxiliary machine 20 (the vacuum pump) starts monitoring immediately. The anomaly detection system 200 sets a "time zone" in which a basic statistic is calculated, a "type (for example, the in-process state or the idle state) of the operational state of semiconductor manufacturing apparatus," a "sorting condition," a "specified sample number," and the like as a reference space creation condition in advance.

Further, the anomaly detection system 200 is provided with a reference space learning function in order to improve the normality/anomaly determination accuracy. Even after the reference space is created by the above method and then the monitoring starts, during the reference space learning period of time (Yes in S17), a calculation of basic statistic of all signals of each time zone is continued in parallel with signal data acquisition, and when a time zone more appropriate than the existing sample data used when the reference space is created is found by the sorting condition, the reference space is updated by replacing the sample data, and then the monitoring is continued. Thus, since the reference space can be revised using the signal data most appropriate for the condition at that point in time during a certain period of time, there is an effect of improving the normality/anomaly detection accuracy. A period of time in which the reference space is automatically updated is set as the reference space creation condition in advance. The anomaly detection system 200 ends the creation of the reference space SS when the reference space learning period of time elapses (No in S17).

As described above, in the second embodiment, in the anomaly detection system 200, the statistic calculating unit 281 calculates statistics of a plurality of time zones for a plurality of types of parameters collected in a plurality of different time zones by the signal collecting unit 110. The reference space data extracting unit 283 extracts upper side statistics among the statistics of the plurality of time zones calculated by the statistic calculating unit 281. The reference space generating unit 284 generates the reference space using a plurality of types of parameters corresponding to the extracted upper side statistics. As a result, it is possible to create the reference space in a short period of time, and it is possible to start facility monitoring early. In other words, since the reference space can be generated promptly and accurately, the accuracy of creating the reference space can be improved without delaying the monitoring start.

Further, in the second embodiment, in the anomaly detection system 200, after the calculation of the divergence by the divergence calculating unit 120 starts and the monitoring by the anomaly detection system 200 starts, the reference space generating unit 284 updates the reference space SS using a plurality of types of parameters corresponding to the upper side statistics extracted by the reference space data extracting unit 283. Thus, since the reference space is automatically updated such that the sample data used to create the reference space is revised during a certain period of time, the anomaly detection accuracy can be improved.

It should be noted that, although the second embodiment has been described in connection with the example in which statistics determined to be good according to an extraction rule are statistic at an upper side (a side at which the value of the parameter X is good), statistics determined to be good according to an extraction rule may be statistics at a lower side (a side at which the value of the parameter X is not good). In this case, the reference space data extracting unit 283 can extracts lower side statistics as statistics satisfying an extraction rule among statistics of a plurality of time zones for each operational state of the semiconductor manufacturing apparatus 10 (the main machine).

Figure 9:
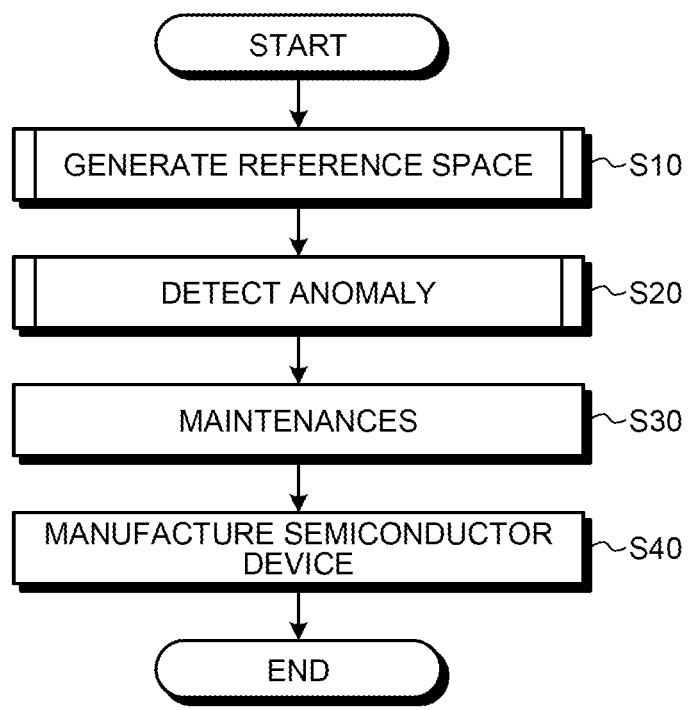
FIG. 9 is a flowchart illustrating a method of manufacturing a semiconductor device using the anomaly detection systems according to the first embodiment and the second embodiment.

Further, the anomaly detection systems according to the first embodiment and the second embodiment can be applied to a method of manufacturing a semiconductor device as illustrated in FIG. 9. FIG. 9 is a flowchart illustrating a method of manufacturing a semiconductor device using the anomaly detection systems according to the first embodiment and the second embodiment.

For example, the anomaly detection system generates the reference space SS by performing the process of S11 to S16 illustrated in FIG. 8 (S10). The anomaly detection system detects an anomaly by performing the process of S21 to S28 illustrated in FIG. 5 (S20). At this time, the process of S11 to S17 illustrated in FIG. 8 may be performed in parallel. Then, an alarm is activated, the user performs the maintenance (a maintenance, a repair, or the like) of the auxiliary machine 20 (S30). At this time, the maintenance of the semiconductor manufacturing apparatus 10 may be performed in parallel. Then, a semiconductor device is manufactured using the auxiliary machine 20 and the semiconductor manufacturing apparatus 10 that have been maintained (S40).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An anomaly detection system for an auxiliary machine incidental to a semiconductor manufacturing apparatus that processes a substrate to manufacture a semiconductor device, comprising:
a collecting unit configured to collect in parallel a plurality of types of parameters related to a state of the auxiliary machine through communication lines from a plurality of sensors, the plurality of sensors being installed in the auxiliary machine, the sensors including temperature sensors and/or current sensors, the auxiliary machine including a vacuum pump and/or a chiller;
a first calculating unit configured to calculate a divergence of a coordinate point from a reference space in a virtual coordinate space of a plurality of types of parameters, the coordinate point being indicated by the plurality of types of collected parameters;
a second calculating unit configured to accumulate the calculated divergence and calculate a cumulative divergence; and
a determining unit configured to compare the calculated cumulative divergence with a threshold value, the threshold value corresponding to a target lifespan of the auxiliary machine; and
an alarm unit configured to activate a visual device or an auditory device to output an alarm indicating an anomaly of the auxiliary machine when the calculated cumulative divergence is larger than the threshold value, the visual device including a display and/or an alarm lamp, the auditory device including a speaker and/or a buzzer.

2. The anomaly detection system according to claim 1, wherein the first calculating unit obtains a vector length reaching from a center of the reference space to the coordinate point, obtains a diameter of the reference space in a direction from the center of the reference space to the coordinate point, and calculates the divergence by dividing the vector length by the diameter.

3. The anomaly detection system according to claim 1, wherein the determining unit determines that the auxiliary machine has not reached an abnormal level when the calculated cumulative divergence is less than the threshold value, and determines that the auxiliary machine has reached the abnormal level when the calculated cumulative divergence is larger than the threshold value.

4. The anomaly detection system according to claim 1, wherein the auxiliary machine performs an auxiliary operation on the semiconductor manufacturing apparatus.

5. The anomaly detection system according to claim 1, further comprising,
a storage unit configured to store information of the reference space.

6. The anomaly detection system according to claim 1, further comprising,
a setting unit configured to set at least one of an initial value of the cumulative divergence and the threshold value according to maintenance history information of the auxiliary machine.

7. The anomaly detection system according to claim 1, further comprising,
an acquiring unit configured to acquire at least one of apparatus information related to at least one of an operational state and a processing condition of the semiconductor manufacturing apparatus and maintenance history information of the auxiliary machine,
wherein the second calculating unit adds the calculated divergence to the cumulative divergence using a weight according to at least one of the acquired apparatus information and the maintenance history information.

8. The anomaly detection system according to claim 7, further comprising,
a setting unit configured to set the weight according to the maintenance history information of the auxiliary machine.

9. The anomaly detection system according to claim 7, further comprising,
a setting unit configured to set at least one of an initial value of the cumulative divergence, the threshold value, and the weight according to the maintenance history information of the auxiliary machine.

10. The anomaly detection system according to claim 1, further comprising:
a third calculating unit configured to calculate statistics of a plurality of time zones for a plurality of types of parameters collected in the plurality of different time zones by the collecting unit;
an extracting unit configured to extract statistics satisfying an extraction rule among the calculated statistics of the plurality of time zones; and
a generating unit configured to generate the reference space using a plurality of types of parameters corresponding to the extracted statistics.

11. The anomaly detection system according to claim 10, further comprising,
a storage unit configured to store the generated reference space.

12. The anomaly detection system according to claim 10, wherein the statistics satisfying the extraction rule are upper side statistics among the statistics of the plurality of calculated time zones.

13. The anomaly detection system according to claim 10, wherein the statistics satisfying the extraction rule are lower side statistics among the statistics of the plurality of calculated time zones.

14. The anomaly detection system according to claim 10, wherein the first calculating unit calculates the divergence of the coordinate point from the reference space generated by the generating unit,
the third calculating unit calculates statistics of a plurality of time zones after the calculating of the divergence by the first calculating unit starts,
the extracting unit extracts the statistics satisfying the extraction rule among the statistics of the plurality of time zones after the calculating of the divergence by the first calculating unit starts, and
the generating unit updates the reference space using a plurality of types of parameters corresponding to the extracted statistics after the calculating of the divergence by the first calculating unit starts.

15. The anomaly detection system according to claim 14, wherein the third calculating unit calculates statistics of a plurality of time zones after the calculating of the divergence by the first calculating unit starts within a certain period of time after the collecting unit starts to collect the plurality of types of parameters,
the extracting unit periodically extracts the statistics satisfying the extraction rule among the statistics of the plurality of time zones after the calculating of the divergence by the first calculating unit starts within the certain period of time, and the generating unit repeatedly updates the reference space within the certain period of time.

16. An anomaly detection system for an auxiliary machine incidental to a semiconductor manufacturing apparatus that processes a substrate to manufacture a semiconductor device, comprising:
- a collecting unit configured to collect in parallel a plurality of types of parameters related to a state of the auxiliary machine through communication lines from a plurality of sensors, the plurality of sensors being installed in the auxiliary machine, the sensors including temperature sensors and/or current sensors, the auxiliary machine including a vacuum pump and/or a chiller;
- a first calculating unit configured to obtain a third vector by subtracting a second vector serving as a standard from a first vector including a plurality of types of parameters, and calculate a divergence by dividing a vector length of the third vector by a standard length;
- a second calculating unit configured to accumulate the calculated divergence and calculate a cumulative divergence; and
- a determining unit configured to compare the calculated cumulative divergence with a threshold value, the threshold value corresponding to a target lifespan of the auxiliary machine; and
- an alarm unit configured to activate a visual device or an auditory device to output an alarm indicating an anomaly of the auxiliary machine when the calculated cumulative divergence is larger than the threshold value, the visual device including a display and/or an alarm lamp, the auditory device including a speaker and/or a buzzer.

17. A method of manufacturing a semiconductor device, comprising:
- collecting in parallel a plurality of types of parameters related to a state of an auxiliary machine through communication lines from a plurality of sensors, the auxiliary machine being incidental to a semiconductor manufacturing apparatus that processes a substrate to manufacture a semiconductor device, the plurality of sensors being installed in the auxiliary machine, the sensors including temperature sensors and/or current sensors, the auxiliary machine including a vacuum pump and/or a chiller;
- calculating a divergence of a coordinate point from a reference space in a virtual coordinate space of a plurality of types of parameters, the coordinate point being indicated by the plurality of types of collected parameters;
- calculating a cumulative divergence by adding the calculated divergence to the cumulative divergence;
- comparing the calculated cumulative divergence with a threshold value, the threshold value corresponding to a target lifespan of the auxiliary machine;
- activating a visual device or an auditory device to output an alarm indicating an anomaly of the auxiliary machine when the calculated cumulative divergence is larger than the threshold value, the visual device including a display and/or an alarm lamp, the auditory device including a speaker and/or a buzzer; and
- manufacturing a semiconductor device using the auxiliary machine and the semiconductor manufacturing apparatus that have been maintained according to a result of the determining.

18. The method of manufacturing the semiconductor device according to claim 17, further comprising:
- acquiring at least one of apparatus information related to at least one of an operational state and a processing condition of the semiconductor manufacturing apparatus and maintenance history information of the auxiliary machine,
- wherein the calculating of the cumulative divergence includes adding the calculated divergence to the cumulative divergence using a weight according to at least one of the acquired apparatus information and the maintenance history information.

19. The method of manufacturing the semiconductor device according to claim 17, further comprising:
- setting at least one of an initial value of the cumulative divergence and the threshold value according to the maintenance history information of the auxiliary machine.

20. The method of manufacturing the semiconductor device according to claim 17, further comprising:
- calculating statistics of a plurality of time zones for a plurality of types of parameters collected in the plurality of different time zones by the collecting;
- extracting statistics satisfying an extraction rule among the calculated statistics of the plurality of time zones; and
- generating the reference space using a plurality of types of parameters corresponding to the extracted statistics.

* * * * *